United States Patent [19]
Ong

[11] Patent Number: 6,031,784
[45] Date of Patent: Feb. 29, 2000

[54] HIERARCHICAL DECODING OF A MEMORY DEVICE

[75] Inventor: Adrian E. Ong, Pleasanton, Calif.

[73] Assignee: G-Link Technology, Santa Clara, Calif.

[21] Appl. No.: 09/148,817

[22] Filed: Sep. 4, 1998

[51] Int. Cl.[7] .................................................. G11C 7/00
[52] U.S. Cl. .............................. 365/230.06; 365/230.01; 365/230.03
[58] Field of Search ........................ 365/230.01, 230.06, 365/230.03

[56] References Cited

U.S. PATENT DOCUMENTS

| | | | |
|---|---|---|---|
| 5,570,319 | 10/1996 | Santoro et al. | 365/230.03 |
| 5,586,080 | 12/1996 | Raad et al. | 365/230.06 |
| 5,774,412 | 6/1998 | Raad et al. | 365/230.06 |
| 5,886,923 | 3/1999 | Hung | 365/185.11 |
| 5,917,744 | 6/1999 | Kirihata et al. | 365/63 |

*Primary Examiner*—Viet Q. Nguyen
*Attorney, Agent, or Firm*—Skjerven, Morrill, MacPherson, Franklin & Friel LLP; Alan H. MacPherson; Philip W. Woo

[57] ABSTRACT

In one aspect of the invention, a circuit for the hierarchical decoding of a memory device includes a local word line for accessing a memory cell. A local word line driver, which drives the local word line, has at most two transistors, each of these transistors coupled to the local word line. In another aspect of the invention, a circuit for the hierarchical decoding of a memory device includes a local word line driver for driving a local word line. A local phase line driver is connected to the local word line driver by a single metal line. The local phase line driver cooperates with the local word line driver for accessing a memory cell.

17 Claims, 3 Drawing Sheets

HIERARCHICAL DECODING OF A MEMORY DEVICE

FIELD OF THE INVENTION

The present invention relates generally to the field of semiconductor integrated circuits, and more particularly, to the hierarchical decoding of a memory device.

BACKGROUND OF THE INVENTION

Integrated circuit (IC) memory devices allow large amounts of data to be stored in relatively small physical packages. One such device is a random access memory (RAM). A RAM comprises a plurality of memory cells which are typically arranged in a matrix of rows and columns. Separate bits of data may be written into, stored, and read out of each of these memory cells. For this, each memory cell is accessible by at least one row line commonly referred to as a "word line."

According to previously developed techniques, a hierarchical scheme can be used for word line addressing or decoding. More specifically, a global word line may be used in conjunction with a plurality of local word lines for access into one or more particular memory cells. Such a previously developed hierarchical scheme is supported by, at a minimum, a global word line driver, one or more local word line drivers, and a phase driver. Typically, the phase driver is coupled to the local word line drivers by at least two separate connecting or metal lines. Each local word line driver is implemented using three or more transistor devices.

An on-going challenge in the design of IC memories is to reduce the size of a surface layout for a memory device. Accordingly, it would be desirable to reduce the surface layout required to implement a hierarchical row decode scheme.

SUMMARY

In accordance with one embodiment of the present invention, a circuit for the hierarchical decoding of a memory device includes a local word line for accessing a memory cell. A local word line driver, which drives the local word line, has at most two transistors, each of these two transistors coupled to the local word line.

In accordance with another embodiment of the present invention, a circuit for the hierarchical decoding of a memory device includes a local word line driver for driving a local word line. A local phase line driver is connected to the local word line driver by a single metal line. The local phase line driver cooperates with the local word line driver for accessing a memory cell.

An important technical advantage of the present invention includes an improved hierarchical row decode scheme for an IC memory device. In one aspect of this improved hierarchical row decode scheme, a local word line driver is implemented using only two transistors which, in one embodiment, can be a p-type transistor and an n-type transistor. In another aspect of the hierarchical row decode scheme of the present invention, only one metal line connects a phase line driver to a respective local word line driver. Accordingly, in comparison to previously developed hierarchical word line schemes which utilize three or more transistors for each local word line driver and at least two metal connections between a phase driver and a respective local word line driver, the present invention allows for smaller local word line drivers, larger metal pitch requirements, and simple array gap decoding circuitry. These, in turn, enable smaller die size, improved yield, and lower manufacturing costs. Other important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENTS

Figure 1:
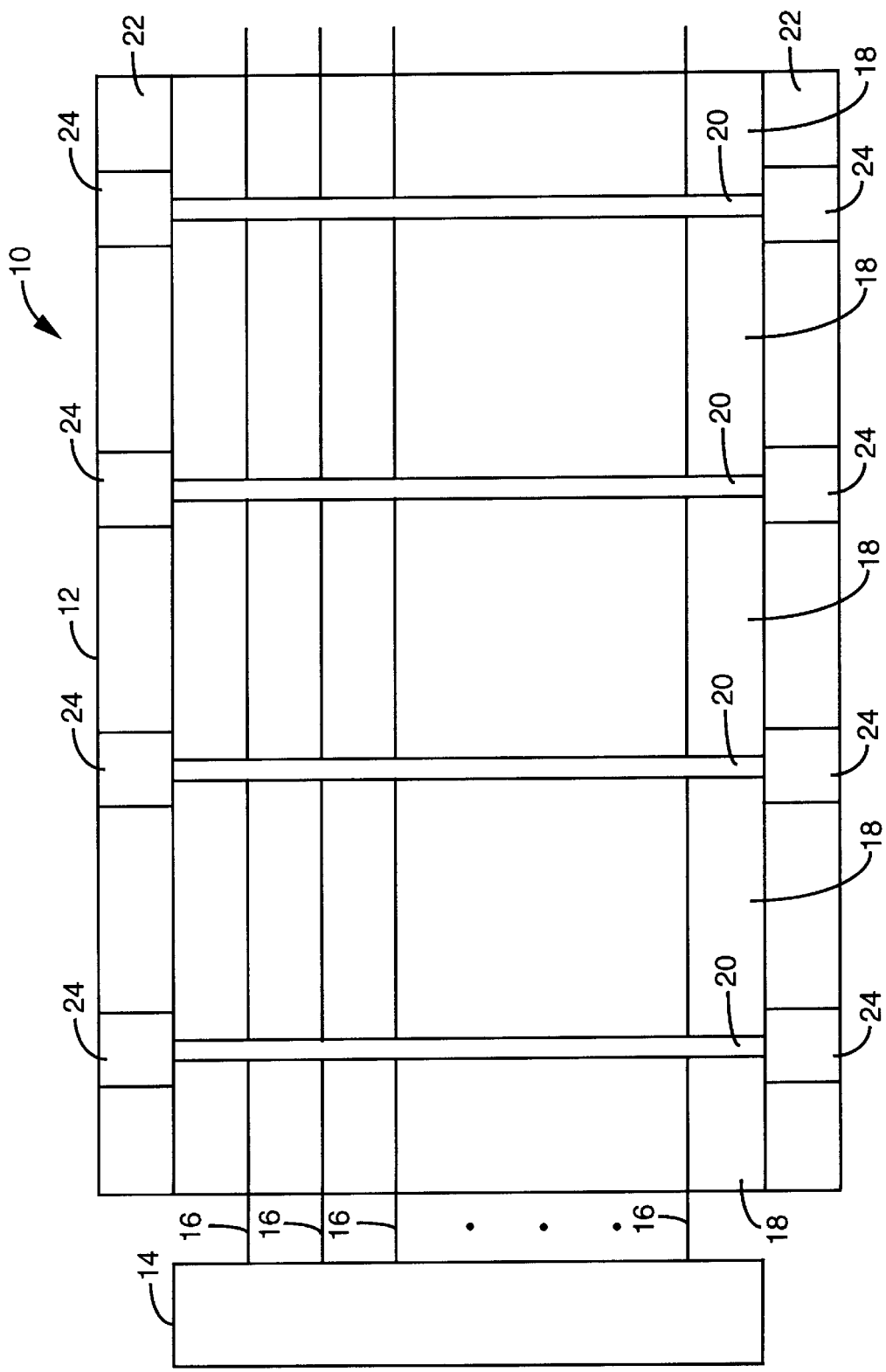
FIG. 1 illustrates an exemplary partial layout for an integrated circuit memory device into which an embodiment of the present invention can be incorporated.
Figure 2:
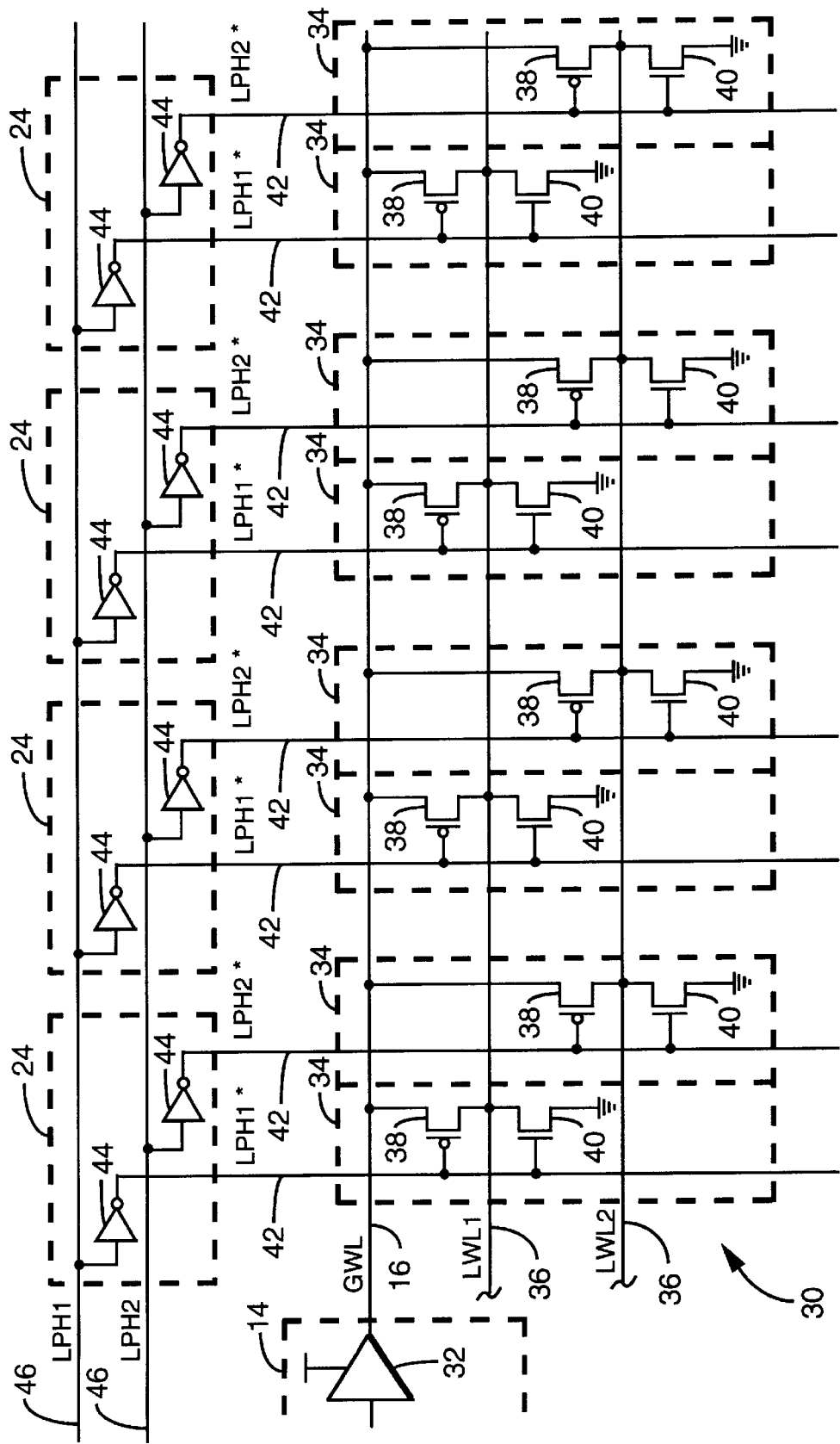
FIG. 2 is a schematic diagram of exemplary circuitry for an improved hierarchical row decode scheme for a memory device, in accordance with an embodiment of the present invention.
Figure 3:
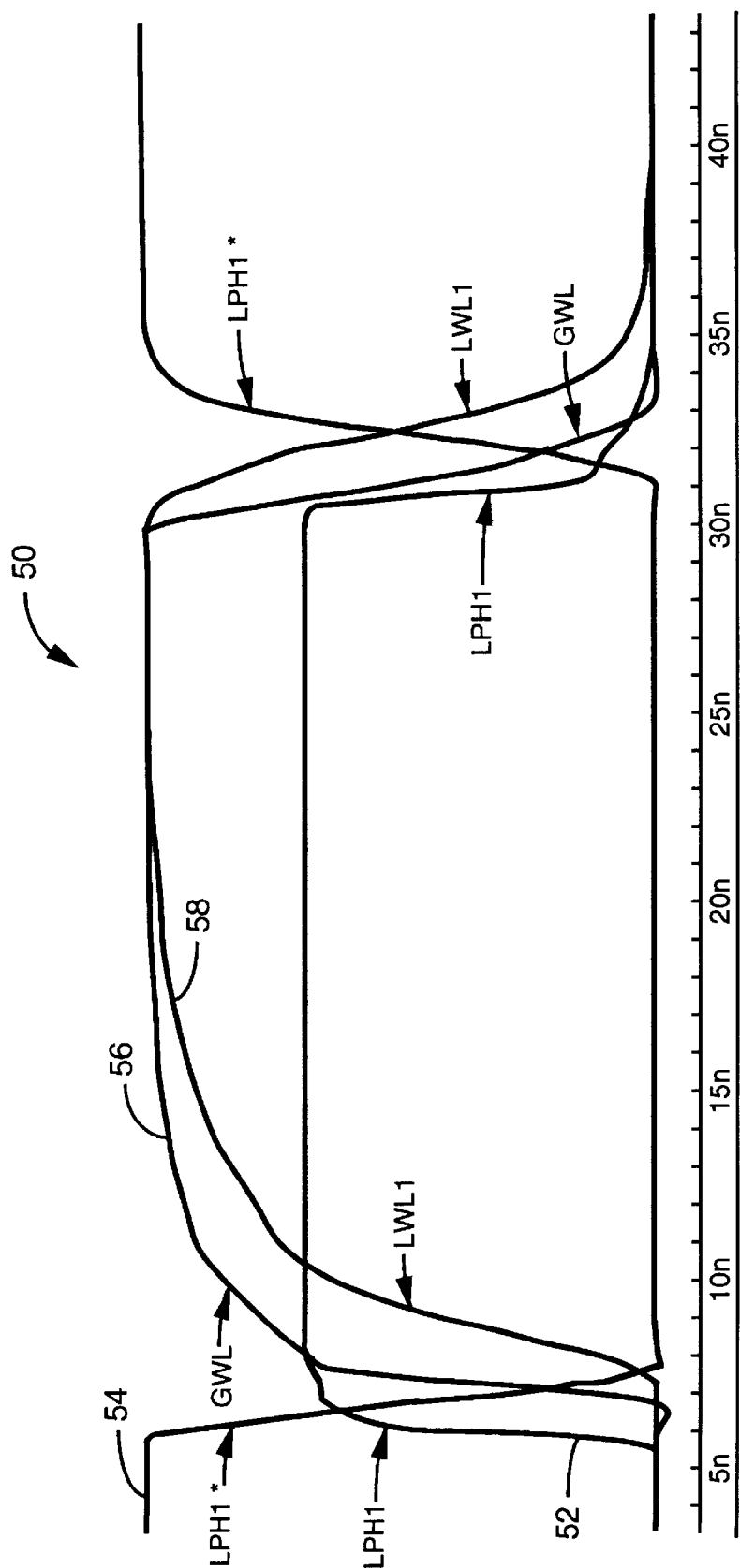
FIG. 3 illustrates a waveform diagram for an improved hierarchical row decode scheme, in accordance with an embodiment of the present invention.

The preferred embodiments of the present invention and their advantages are best understood by referring to FIGS. 1–3 of the drawings. In the drawings, like numerals are used to for like and corresponding parts.

FIG. 1 illustrates an exemplary partial layout of an integrated circuit (IC) memory device 10 into which an embodiment of the present invention can be incorporated. Memory device 10, which can be an implementation for random access memory (RAM), includes a memory area 12 coupled to a global driver area 14 by one or more global word lines (GWL) 16. As used herein, the terms "connected," "coupled," or any variant thereof, means any connection or coupling, either direct or indirect between two or more elements.

Memory area 12 is separated into a number of arrays 18, each of which comprises a plurality of memory cells accessible by one or more respective word lines 16. Each memory cell functions to maintain data. In particular, separate bits of data may be written into, stored, and read out of each of these memory cells. The memory cells may be fabricated in any suitable technology, such as metal-oxide semiconductor (MOS) technology, according to techniques well-known and understood by those skilled in the art of IC memory.

A plurality of local word line driver areas 20 are disposed between memory arrays 18 in memory area 12. Each local word line driver area 20 comprises a number of local word line drivers which support the reading and writing of data to and from cells in memory arrays 18. In accordance with an embodiment of the present invention, each of these local word line drivers can be implemented using only two transistors, as described below in more detail. This implementation of the present invention requires less surface area than previously developed implementations of local word line drivers, thereby providing a significant technical advantage.

One or more pitch areas 22 are provided adjacent memory arrays 18 of memory area 12. Each pitch area 22 comprises a number of circuits which support the writing, storage, access, and reading of information from memory arrays 18. For example, pitch areas 22 may each include one or more sense amplifiers for detecting or reading the stored information. Each sense amplifier area 22 may include one or more gap areas 24. Each gap area 24 may include one or more phase driver circuits which output phase signals for enabling or controlling the local word line drivers to access memory cells in memory area 12. In accordance with the embodiment of the present invention, each phase driver circuit may be coupled to one or respective local word line drivers using only a single metal or connection line. The use of a single connection line significantly reduces the surface area required for implementing a memory device.

Global word line area 14 comprises one or more global word line drivers for driving global word lines 16. Each global word line driver cooperates with one or more respective local word line drivers to provide a hierarchical scheme for accessing the memory cells in memory area 12.

FIG. 2 is a schematic diagram of exemplary circuitry 30 for implementing a hierarchical row decode scheme, in accordance with an embodiment of the present invention. Circuitry 30 for the improved hierarchical row decode scheme includes elements which can be located in memory area 12, global word line area 14, and gaps 24 (FIG. 1).

A global driver 32 is provided in global driver area 14. Global driver 32 generally functions to drive a respective global word line (GWL) 16 when the driver is enabled. Global driver 32 can be implemented according to techniques and circuitry well known to those in the art. In one embodiment, global driver 32 can be implemented as a level translator circuit which changes or alters the voltage level of an incoming signal, for example, from Vcc to Vpp.

A number of local word line drivers 34 are coupled to global word line 16. Each local word line driver 34 is associated with one or more memory cells and generally functions to drive a respective local word line (LWL1 or LWL2) 36 for access to such memory cell(s). More than one local word line driver 34 can be provided for each local word line 36. As shown, one half of local word line drivers 34 drive LWL1 and the other half of local word line drivers 34 drive LWL2.

Each local word line driver 34 is implemented with a p-type transistor 38 and an n-type transistor 40. The source of transistor 38 is coupled to global word line 16 and the drain is coupled to the respective local word line 36. The drain of transistor 40 is coupled to the respective local word line 36 and its source is connected to ground (or alternatively, Vss). The gates of transistors 38 and 40 are connected to a respective local phase line (LPH1* or LPH2*) 42, over which local word line driver 34 receives a driven local phase signal.

The driven local phase signals activate local word line drivers 34. In one embodiment, one half of local word line drivers 34 are activated by the signal on LPH1* and the other half of local word line drivers 34 are activated by the signal on LPH2*.

At least one local phase driver 44 can be provided in each gap 24. As shown, each gap 24 includes two local phase drivers 44. Local phase drivers 44 are connected to local phase lines (LPH1 or LPH2) 46, over which phase drivers 44 receive local phase signals. As shown, one local phase driver 44 in each gap 24 operates on the signal of LPH1 and the other local phase driver 44 operates on the signal of LPH2. Each local phase driver 44 functions to drive the respective local phase signal to generate a respective driven local phase signal. Local phase drivers 44 can be implemented according to techniques and circuitry well known to those in the art. In one embodiment, local phase drivers 44 may each be implemented as a level translator circuit which changes or alters the voltage level of the respective incoming phase signal, for example, from Vcc to Vpp. Each local phase driver 44 is connected to at least one corresponding word line driver 34 via a respective local phase line 42.

In operation, global word line driver 32 may be enabled so that it can drive a global word line signal. One of the local phase signals appearing on the local phase lines (LPH1 or LPH2) 46 may go high. This signal is driven and inverted by corresponding phase line drivers 44 in each gap 24 to produce a low value on the respective driven local phase lines (LPH1* or LPH2*) 42. The low value turns on p-type transistor 38 and turns off n-type transistor 40 in the respective local word line drivers 34, thereby activating this first set of local word line drivers 34. At the same time, the other local phase signal is low so that the remaining local phase drivers 44 output a high signal on the respective driven local phase lines (LPH1* or LPH2*) 42. In each of the corresponding local word line drivers 34, this high signal turns off the p-type transistor 38 and turns on the n-type transistor 40, thus de-activating this second set of local word line drivers 34.

The global word line signal can go high, thus causing global word line driver 32 to output a high value on global word line (GWL) 16. In turn, this high value on GWL 16 causes the first set of local word line drivers 34 to output a high value on the corresponding local word line (LWL1 or LWL2) 36, thus allowing access into one or more respective memory cells. Because the second set of local word line drivers 34 is not activated, the signal appearing on the other local word line 36 remains low, thus preventing access into the respective memory cells.

Afterwards, the local phase signal which was previously high goes low, and the local phase signal which was previously low goes high. This causes the first set of local phase drivers 44 to output a high signal on the respective driven local phase lines 42 and the second set of local phase drivers 44 to output a low signal on the respective lines 42. When a high value appears on GWL 16, the first set of local word line drivers 34 outputs a low value on the corresponding local word line 36, thereby preventing access to the respective memory cells. The second set of local word line drivers 34 outputs a high value on its corresponding local word line 36, thereby allowing access to its respective memory cells.

A technical advantage of the present invention includes implementing a local word line driver 34 using only two transistors—i.e., p-type transistor 38 and n-type transistor 40. Another technical advantage of the present invention includes connecting a local phase driver 44 and corresponding local word line driver 34 with only a single metal line—i.e., driven local phase line 42. Because previously developed designs required a minimum of three transistors for a local word line driver and at least two metal lines for connecting a local phase driver to a corresponding local word line driver, the present invention reduces the amount of surface space required to implement a memory device. Furthermore, the simplified implementation of the present invention enables improved yield and lower manufacturing costs.

FIG. 3 illustrates an exemplary waveform diagram 50 for a hierarchical row decode scheme, according to an embodiment of the present invention. Diagram 50 includes a number of waveforms for various signals input into and generated by a hierarchical row decode architecture of the present invention, such as that illustrated in FIG. 2.

As shown, these signals include a local phase signal (LPH1) 52 which can be input into a local phase driver 44.

A driven local phase signal (LPH1*) signal 54 is derived from LPH1 signal 52. In particular LPH1* signal 54 is generated by inverting and amplifying (or boosting) LPH1 signal 52. A global word line (GWL) signal 56 can be output by global word line driver 32. A local word line (LWL1) signal 58 may be output by a respective local word line driver 34. As shown, when LPH1 signal 52 goes from low to high, the LPH1* signal 54 goes from high to low, thus activating one set of local word line drivers 34. Shortly thereafter, the global word line signal 56 may transition from low to high, thus causing the activated word line drivers 34 to drive the respective local word line 36. Consequently, a corresponding local word line signal (LWL1) 58 transitions from low to high, thereby allowing access to one or more respective memory cells.

Afterwards, the LPH1 signal 52 transitions from high to low, and accordingly, LPH1* signal 54 transitions from low to high. This de-activates the respective local word line drivers 34 by turning off p-type transistors 38 and turning on n-type transistors 40 contained therein. Consequently, the respective local word line drivers 34 cause LWL1 signal 58 to go low. This prevents further access to the respective memory cells. The GWL signal 56 may transition from high to low.

Although the present invention and its advantages have been described in detail, it should be understood that various changes, substitutions, and alterations can be made therein without departing from the spirit and cope of the invention as defined by the appended claims.

What is claimed is:

1. A circuit for hierarchical decoding of a memory device comprising:
    a local word line for accessing a memory cell; and
    a local word line driver for driving the local word line, the local word line driver consisting of a first transistor and a second transistor coupled to the local word line, the first transistor comprising a p-type transistor, the second transistor comprising an n-type transistor.

2. The circuit of claim 1 wherein:
    the first transistor is coupled between a global word line and the local word line; and
    the second transistor is coupled between the local word line and ground.

3. The circuit of claim 2 comprising a global word line driver for driving the global word line.

4. The circuit of claim 1 comprising a local phase line driver for driving a local phase line, the local phase line driver coupled to the local word line driver with a single connection.

5. A circuit for hierarchical decoding of a memory device comprising:
    a local word line driver for driving a local word line, the local word line driver consisting of a first transistor and a second transistor coupled to the local word line; and
    a local phase line driver connected to the local word line driver by a single metal line, the local phase line driver cooperating with the local word line driver for accessing a memory cell.

6. The circuit of claim 5 wherein:
    the first transistor comprises a p-type transistor; and
    the second transistor comprises an n-type transistor.

7. The circuit of claim 6 wherein:
    the first transistor has a gate coupled to the local phase line, a source coupled to a global word line, and a drain coupled to the local word line; and
    the second transistor has a gate coupled to the local phase line, a drain coupled to the local word line, and a source coupled to ground.

8. The circuit of claim 5 wherein:
    the first transistor comprises a p-type transistor coupled between a global word line and the local word line; and
    the second transistor comprises an n-type transistor coupled between the local word line and ground.

9. The circuit of claim 8 comprising a global word line driver for driving the global word line.

10. A memory device comprising:
    a memory array having a plurality of memory cells;
    a global word line driver coupled to the memory array by a global word line, the global word line driver for driving the global word line;
    a local phase driver for driving a local phase line; and
    a local word line driver coupled to the global word line and the local phase line, the local word line driver consisting of a first transistor and a second transistor, the local word line driver for driving a local word line in response to signals received over the global word line and the local phase line, thereby cooperating with the global word line driver and the local phase line driver for access to at least one memory cell in the memory array.

11. The memory device of claim 10 wherein the local phase line driver is coupled to the local word line driver with a single connection.

12. The memory device of claim 10 wherein:
    the first transistor comprises a p-type transistor; and
    the second transistor comprises an n-type transistor.

13. The memory device of claim 10 wherein:
    the first transistor comprises a p-type transistor coupled between the global word line and the local word line; and
    the second transistor comprises an n-type transistor coupled between the local word line and ground.

14. A circuit for the hierarchical decoding of a memory device comprising:
    a local word line for accessing a memory cell; and
    a local word line driver for driving the local word line, the local word line driver having less than three transistors, each transistor coupled to the local word line.

15. The circuit of claim 14 wherein:
    the local word line driver has two transistors, one of the two transistors comprising a p-type transistor, and the other of the two transistors comprising an n-type transistor.

16. The circuit of claim 14 wherein:
    the local word line driver has two transistors, one of the two transistors comprising a p-type transistor coupled between a global word line and the local word line, and the other of the two transistors comprising an n-type transistor coupled between the local word line and ground.

17. The circuit of claim 14 comprising a local phase line driver for driving a local phase line, the local phase line driver coupled to the local word line driver with a single connection.

* * * * *